United States Patent [19]

Wistling

[11] Patent Number: 4,797,782
[45] Date of Patent: Jan. 10, 1989

[54] ARRANGEMENT IN ONE OR MORE UNITS DISPOSED IN AN OUTER UNIT

[75] Inventor: Roger Wistling, Karlskoga, Sweden

[73] Assignee: Aktiebolaget Bofors, Bofors, Sweden

[21] Appl. No.: 54,178

[22] PCT Filed: Oct. 2, 1986

[86] PCT No.: PCT/SE86/00443

§ 371 Date: May 20, 1987

§ 102(e) Date: May 20, 1987

[87] PCT Pub. No.: WO87/02214

PCT Pub. Date: Apr. 9, 1987

[30] Foreign Application Priority Data

Oct. 3, 1985 [SE] Sweden .................................. 8504570

[51] Int. Cl.$^4$ ............................................. H05K 7/20
[52] U.S. Cl. .................... 361/384; 165/104.33; 174/16.1; 174/35 R; 361/424
[58] Field of Search ............... 174/16 R, 35 R, 35 MS; 62/418; 165/104.33, 104.34; 361/393-395, 382-385, 415, 424

[56] References Cited

U.S. PATENT DOCUMENTS

| 3,364,838 | 1/1968 | Bradley | 174/16 R |
|---|---|---|---|
| 3,467,892 | 9/1969 | Sprude | 361/384 |
| 3,608,280 | 9/1971 | Martin | 174/16 R |
| 4,315,300 | 2/1982 | Parmerlee et al. | 361/382 |
| 4,352,274 | 10/1982 | Anderson | 361/384 |
| 4,386,651 | 6/1983 | Reinhard | 165/104.34 |
| 4,600,050 | 7/1986 | Noren | 165/104.33 |

FOREIGN PATENT DOCUMENTS 2078558 11/1971 France .

OTHER PUBLICATIONS

Derwent's Abstract Imanov G457/4C/30*SU-70-0-941, 12/5/79.
IBM Technical Disclosure Bulletin, vol. 8, No. 11, Apr. 1966, "Counter-Flow Cooling System" R. C. Chu.

Primary Examiner—G. P. Tolin
Attorney, Agent, or Firm—Pollock Vande Sande & Priddy

[57] ABSTRACT

A portable, low-weighted outer unit defines substantially asceptic space in which inner units are disposed. Each respective inner unit encloses electronic components which are placed on assembly boards stacked upright in the inner units. A fan is provided to effect the circulation of the air in the space and past the inner units. Another fan is provided for drawing the outside air through the heat exchanger and through the outer unit. The heat transported from the electronic components by the flow of the inner air is transferred to the outer air whereby the temperature of the inner air inside the outer unit is kept reduced.

10 Claims, 2 Drawing Sheets

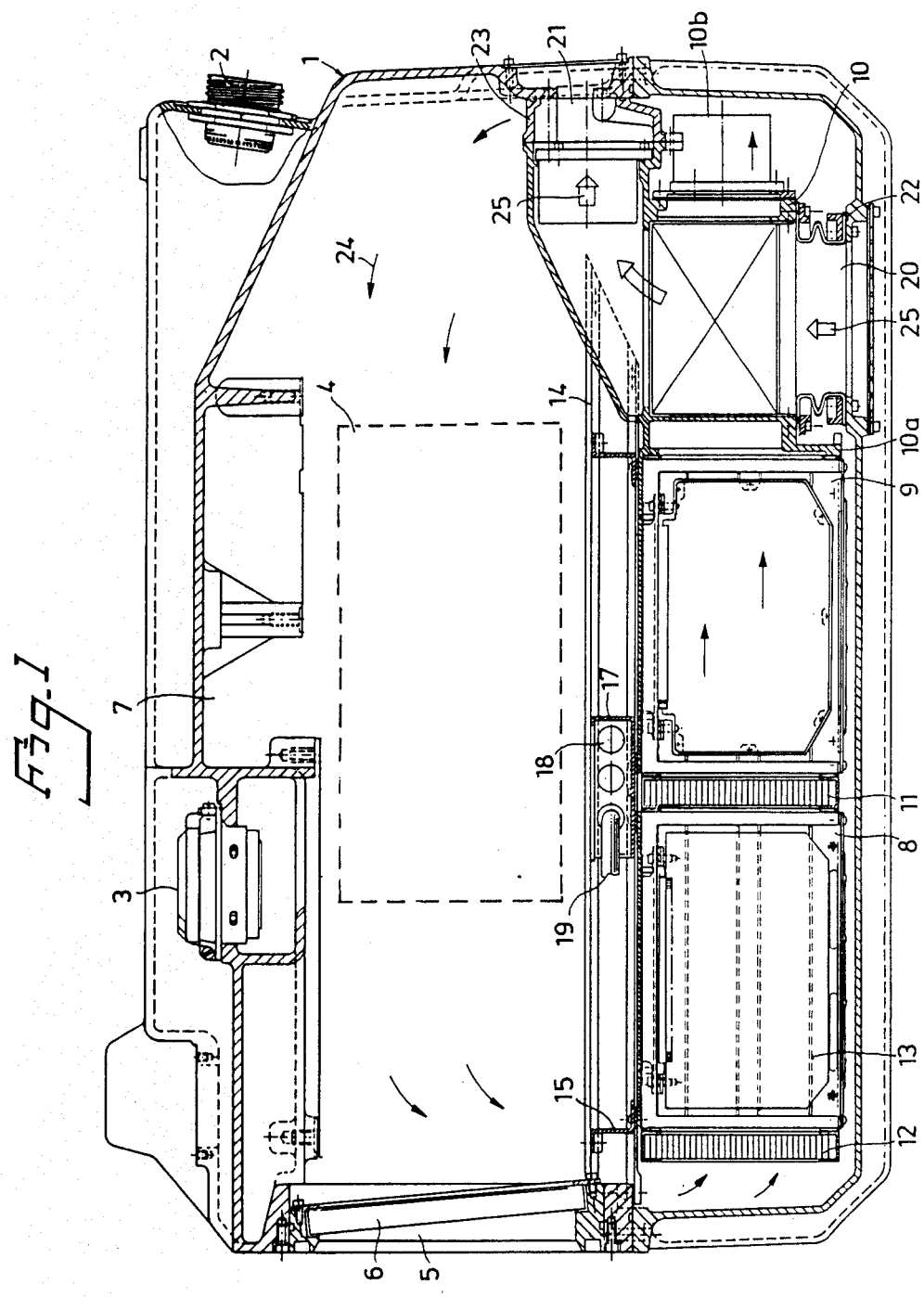

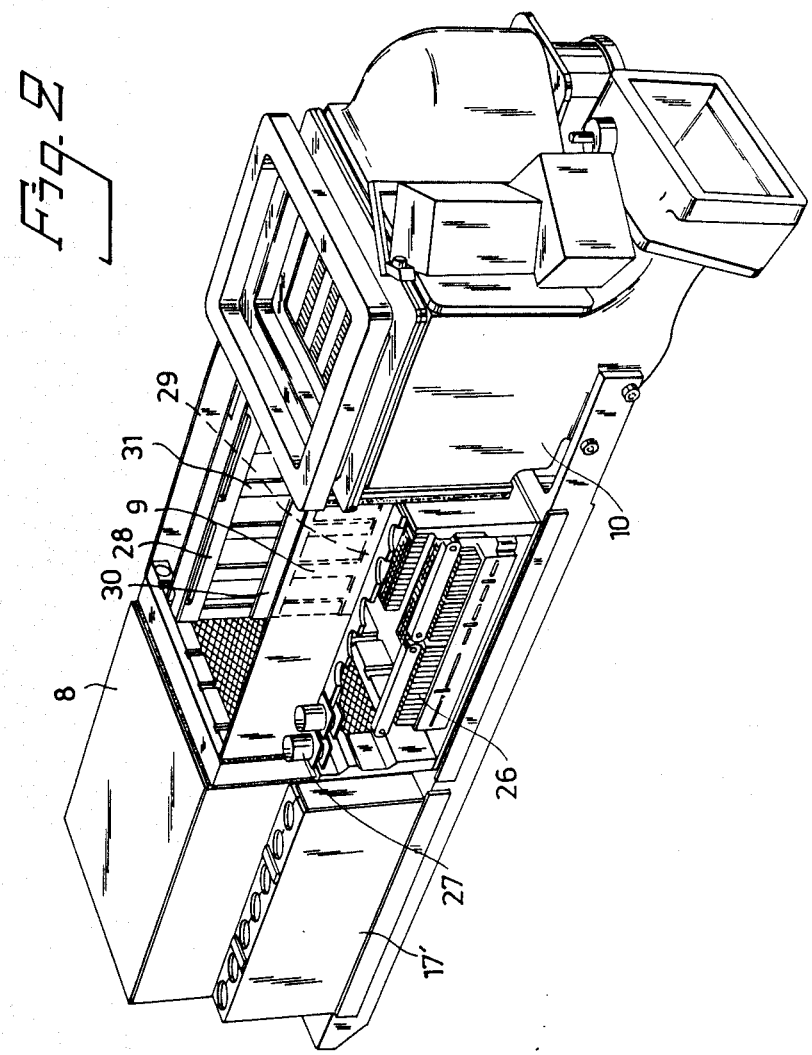

ARRANGEMENT IN ONE OR MORE UNITS DISPOSED IN AN OUTER UNIT

SUMMARY OF THE INVENTION

The present invention relates to an arrangement for one or more inner units enclosing electronic components, the inner unit or units being disposed in at least one substantially aseptically sealed space within an outer unit. The electronic components are disposed on assembly boards edge-stacked in the inner unit(s).

One of the contemplated fields of utilization of the present invention is in sighting equipment, in particular ground-based sighting equipment. Such sighting equipment may be employed in conjunction with FEBA ammunition equipment and primarily should consist of portable equipment, which entails that its overall weight must be kept to a minimum.

Such sighting equipment includes an optical section which must be kept dust-free within the sighting unit. The optical section cooperates with an electronic section which is of complex construction and function.

One indispensible requirement place on such sighting equipment is to keep its outer dimensions at a minimum. This entails, for instance, high packing density for the components in the electronic equipment. This in turn involves problems as far as heat generation is concerned. Excessive heat can damage vital components in the sighting equipment.

Summary of the Invention

The about-outlined problems involved in weight and space entail difficulties in disposing the requisite electronics and optics so as to obtain a high degree of functional reliability, meeting the stringent demands placed on the sighting equipment.

One of the primary objects of the present invention is to solve the structure problem as outlined above. The concept forming the basis of the present invention is, here, that the electronics be disposed in the same space as the optical section which, in and of itself, must be allocated an as good as aseptic (for example dust-free) space.

According to the novel arrangement the present invention a cooler unit is provided with an air heat exchanger operative to cause, in the above-mentioned space, circulation of the inner air in the space and to lead the inner air past the electronic components and the heat exchanger; and to lead outer air located outside the outer unit through the heat exchanger and thereby, by means of the outer air, to reduce the inner air temperature or to keep this temperature at a reduced level.

The cooler unit is to be disposed together with one or more inner units in the above-mentioned space, may be mounted together in series with the inner unit. In such cases that as involve two or more inner units, the interconnected modules make a row which is placed along the one inner bounding side of the outer unit. Preferably, each respective inner unit and the cooler unit are separated by filters against electromagnetic impulse. At its free end, the outermost located inner unit in the row is, in such an instance, also provided with a filter of the above-mentioned type. Such filters are known in this art and may consist of so-called honeycomb filters. In the present case, a characteristic feature of the filter is that it allows passage of inner air for cooling the electronic components, at the same time constituting an effective barrier to sn electromagnetic interference (EMI).

The present invention further embraces the concept of how the upright stacked boards are to be applied in each respective inner unit. Thus, it is possible to employ frames which each carry two boards disposed in parallel on either side of the frame. The frame, and the two boards carried thereby, are disposed such that the circulated inner air may pass on either side of each respective board. This function may be attained in that the frame is constructed of cross-pieces of reduced cross section, thus making for the passage of inner air.

One embodiment of the present invention also considers the arrangement and disposition of the external electric connection to the electronic components disposed within the units. Each respective inner unit may include an EMI disturbance-free connection unit. One preferred embodiment of the present invention calls for the employment of an extension section of each respective inner unit, this extension section including a lift-off side member. Each respective electric connection unit is provided with one or more recesses for connection cables. A metal casing is disposed in each respective recess, in which a screen or guard on each respective connection cable may be anchored. In such a situation, the sleeve, guard, connection unit are disposed so as to ensure freedom of disturbance from electromagnetic interference (EMI).

Each respective unit is of metal/alloy. In one preferred embodiment, connection strips are disposed at the bottom of each respective unit. The frames with their associated boards are loaded into the unit from above and the electric connection devices of the boards are united with their corresponding devices in the connection strips. The base portion on each respective board is provided with electric lead-ins so that the internal mutual connection may be established with the electric connection devices disposed on the outside of the inner unit. The electric connection contemplated here may be effected in a known manner, for example by the intermediary of bars, wire connection leads etc.

According to the present invention, it will be possible to attain a high packing density of the electronic components without heat generating occasioning any disturbance to the overall function of the equipment. Moreover, the electronic equipment will be EMI-guarded. The dimensions of the outer unit can be kept at a minimum.

The nature of the present invention and its aspects will be more readily understood from the following brief description of the accompanying Drawings, and discussion relating thereto in respect of a currently proposed embodiment of an apparatus according to the present invention which displays those characteristics significant of the invention.

In the accompanying Drawings:

BRIEF DESCRIPTION OF THE ACCOMPANYING DRAWINGS

FIG. 1 shows, in horizontal section, one embodiment of an outer unit and inner units disposed therein together with a cooler unit; and FIG. 2 is an oblique perspective panoramic view of the detailed construction of the inner units and cooler units.

DESCRIPTION OF PREFERRED EMBODIMENTS

Referring to the Drawings, FIG. 1 shows the disposition of the optics section and the electronics section in portable sighting equipment which is to be employed in conjunction with the firing of missiles, rockets etc. The sighting equipment comprises essentially an outer unit 1. This unit is provided with two connections 2 and 3. The outer unit is intended to be supported on a frame or the like (not shown on the Drawing). Since the configuration and construction of the outer unit may differ, it will not be described in greater detail here.

The outer unit encloses a symbolically indicated optical section 4 whose exit aperture is indicated as 5. A lens 6 is disposed in the aperture. The inner space of the outer unit is shown by reference number 7. This space must be kept in a substantially aseptic contaminant-free, such as dust-free state and the outer unit is sealed-off for this purpose.

Viewed along one inner bounding side, there is disposed in the outer unit a electronic equipment in two inner units 8 and 9. For cooling the electronic equipment in the inner units, use is made, according to the present invention, of a cooler unit 10 which may operate according to principles known in art. Hence, the cooler unit comprises a cross-current heat exchanger (not shown in detail) and a fan motor (not shown in detail). The units 8, 9 and 10 are disposed in a row. The cooler unit 10 is integral with the inner unit 9. The inner units are disposed with an interjacent EMI barrier filter 11. At its free end, the inner unit is provided with a filter 12, corresponding to the filter 11.

The electronic equipment comprises components which are disposed on assembly boards 13 stacked upright and oriented in a direction which coincides with the file of the units 8, 9 and 10. The boards 13 may be loaded down into each respective unit from the upper sides thereof. The boards display known electric connection devices (connection strips) which may be interconnected with corresponding electrical connection devices (connection strips) on the bottom side of each respective inner unit. Within the outer unit 1, there is disposed an assembly bar 14 in which the inner units 8 and 9 are anchored by the anchorage members (profiles) 15. The cooler module is fixedly mounted in the unit 9 by a connection flange 10a. This connection may be effected in a known manner. In the embodiment according to FIG. 1, the units 8 and 9 may be united by their connection devices 17 which are provided with connection apertures 18 for a symbolically indicated outer cable 19. The cooler module is also fixedly retained in the outer unit 1 by the intermediary of its air intake 20 and exhaust outlet 21. The air intake 20 is suspended in a resilient rubber bellows device 22 and the air discharge outlet 21 is anchored by the intermediary of its flange 23.

On its activation, the fan motor (not shown in FIG. 1) will cause a circulation of the inner air in the space 7. This circulation is indicated on the drawing by single-bodied arrows 24. The inner air circulates via the optics 4, the filter 12, the unit 8, the filter 11, the unit 9 and the inner exhaust outlet 10b of the cooler unit and back towards the optics 4, and so on. The circulating inner air will sweep along the short sides supporting the components and over frames which support the boards in accordance with that described below. Moreover, another fan motor (not shown) will draw in outer air located outside the outer unit 1 by the intake 20, and lead this outer air through the cross-current heat exchanger and out through the exhaust outlet 21. The outer air flow is indicated by the block arrows 25. Thus, the inner air will be employed as a medium for transporting heat from the electronic components to the cross-current heat exchanger, where the heat is lead off by means of the outer air 25.

FIG. 2 shows a detailed embodiment of the units 8, 9 and 10. The units 8 and 9 are of metal/alloy. In this case, the connection device 17' is of a modified design in relation to the embodiment according to FIG. 1. The connection device 17' includes a removable side section which, in FIG. 2, has been removed from the unit 9. The connection device includes electrical connection devices 26 which may be constructed according to the jack plug connection principle. The connection devices or contactors may be of the type which includes wafer contactors whose electrical contact surfaces are insertable in corresponding contactor devices, connection bars, on the bottom portion of the connector device 17'. The contactor devices 26 are connected to the outer power supply connection cf. indicated as 19 in FIG. 1. This outer connection is effected by the intermediary of sleeves 27 of metal in accordance with the above disclosure.

The boards which carry the electronic components may, in cases of extremely high packing density, be of the type known in this art as ceramic boards. The boards are disposed on frames preferably of metal, these including two parallel outer sections 28, 29 (28 being the uppermost), a central section 30 disposed in parallel with outer sections and a number of crosspieces 31 interconnecting the outer and intermediate sections. The outer and intermediate sections extend in the longitudinal direction of the board and the crosspieces in the transverse direction of the board. One such frame mounts two boards, one on each side. In this instance, these crosspieces 31 are of reduced cross-section, thus making it possible for the inner air, on this circulation by means of the cooler unit, to pass on both sides of the board. Not only will the temperature of the boards and the components be reduced by means of the circulating inner air and the outer air, but also the frames will be cooled by the inner air.

The inner units consist of wafer-walled box units of metal/alloy. The frames with boards mounted thereon are loaded down from the upper side of each respective unit. To this end, each respective unit is provided with a wafer-walled removable lid.

Assembly of the boards on the frames may be effected by means of anchorage devices (not shown in detail) for example screws or the like. This technique is known in the art and will not, therefore, be described more closely here. The boards are also previously known in the art.

The present invention should not be considered as restricted to that embodiment described above and shown on the drawings, many modifications being conceivable without departing from the spirit and scope of the appended claims.

What we claim and desire to secure by Letters Patent is:

1. An apparatus comprising:
   a portable, low-weighted outer unit defining an inner, dust-free aseptic space housing optical components and heat generating electronic components;

inner units provided in said space and disposed along one inner wall of said outer unit to form a channel having an inlet and outlet positioned close to two opposite inner walls of said outer unit;

at least one, first inner unit encasing said electronic components which are disposed on assembly boards stacked in said first unit;

a second inner unit including a cooler provided with an air heat exchanger;

a first circulation means for circulation of inner air in said space and through said inlet of said channel past said electronic components, said heat exchanger of said cooler unit; said outlet of said channel, said optical components in said space and back to said inlet of said channel;

a second circulation means for drawing in outer air through said heat exchanger and out through an exhaust outlet in said outer unit;

wherein said heat transported from said electronic components by said inner air flow is transferred to said outer air flow whereby the temperature of said inner air in said space is kept reduced.

2. The apparatus according to claim 1 wherein said cooler unit is assembled in series with one of said inner units; each respective inner unit being provided on an air-intake side, with a filter which is permeable to said inner air flow but is operative as a barrier to electromagnetic interference (EMI).

3. The apparatus according to claim 1, wherein two or more inner units interconnected in a subsequent row are separated by filters permeable to said inner air flow but operative against electromagnetic impulses; and wherein a filter is provided at the free end of the outermost-located inner unit.

4. The apparatus according to claim 3 wherein the assembly boards are disposed on frames which each carry two boards disposed substantially in parallel on either side of said frame, said frames being disposed so as to allow said inner air to pass on both sides of each board.

5. The apparatus according to claim 4 wherein each frame carries two substantially parallel outer sections and a central portion disposed there between and substantially parallel to said outer sections, said sections being interconnected with cross-pieces extending between said outer and central sections, said crosspieces having reduced dimensions allowing said inner air to pass on either side of boards fixedly retained on said frames.

6. The apparatus according to claim 5 wherein each respective inner unit is provided with a connection device for outer electric connections of electronic components.

7. The apparatus according to claim 6 wherein each respective inner unit provides the disturbance-suppressed against EMI enclosure for its associated electronic equipment and the connection thereof and at the same time efficient cooling of the electronic components.

8. The apparatus according to claim 7 wherein each respective inner unit with associated electronic connections is made of metal/alloy; the electric connection being made by metal-screened connection conduits which are led into each respective inner units by metal connection sleeves.

9. The apparatus according to claim 8 wherein said inner unit is being provided with electrical leads which are mechanically sealed against the material constituting the bottom portion to provide the disturbance-guarded enclosure for electronic components; said electronically it is being mutually electrically interconnected on the outside of each respective inner unit.

10. The apparatus according to claim 6 wherein respective inner units with associated electric connection devices are made of metal alloy.

* * * * *